US006480065B1

United States Patent
Herrera et al.

(10) Patent No.: US 6,480,065 B1
(45) Date of Patent: Nov. 12, 2002

(54) CMOS FOLDING AMPLIFIER HAVING HIGH RESOLUTION AND LOW POWER CONSUMPTION

(75) Inventors: Ruben Herrera, Short Hills, NJ (US); Sanjeev Ranganathan, New York, NY (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/873,559

(22) Filed: Jun. 4, 2001

(51) Int. Cl.[7] ............................................... H03F 3/45
(52) U.S. Cl. ................................... 330/253; 330/9
(58) Field of Search ......................... 330/9, 253, 257

(56) References Cited

U.S. PATENT DOCUMENTS 5,594,633 A  *  1/1997  Asazawa .................. 323/315
5,703,912 A  * 12/1997  Wang et al. .............. 330/253
6,300,845 B1 * 10/2001  Zou ........................ 330/288

* cited by examiner

Primary Examiner—Robert Pascal
Assistant Examiner—Khanh Van Nguyen
(74) Attorney, Agent, or Firm—W. Daniel Swayze, Jr.; W. James Brady; Frederick J. Telecky, Jr.

(57) ABSTRACT

A folding differential amplifier includes a switching preamplifier used to select between first and second differential amplifiers as a function of an input signal. The switching preamplifier includes first and second outputs that are coupled together by a first shorting switch having an open phase and a closed phase. The first and second outputs are held at a steady state value during the closed phase of the shorting switch and allowed to vary during the open phase of the shorting switch. First and second differential amplifiers each have first and second outputs and the first output of the first differential amplifier is coupled to the second output of the second differential amplifier. Similarly, the second output of the first differential amplifier is coupled to the first output of the second differential amplifier. These cross coupled outputs form first and second amplifier outputs respectively. The first and second amplifier outputs of the can be coupled together by a second shorting switch having a closed phase and an open phase. The closed phase of the second shorting switch lasting longer than the closed phase of the first shorting switch.

23 Claims, 10 Drawing Sheets

(Prior Art)

CMOS FOLDING AMPLIFIER HAVING HIGH RESOLUTION AND LOW POWER CONSUMPTION

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

High speed folding amplifiers are often used in flash analog-to-digital converters (ADC) to reduce the number of comparators that are required to perform the conversion. Typically, folding amplifiers are effective when the input signals are allowed to settle and the DC gain of the amplifier is used. However, if the input signal undergoes a sudden and large change from a value close to a first reference level to a point close to a second reference level during the sampling time, the input may not settle prior to the hold phase of the input. In this case the dynamic gain of the amplifier is used to provide the output signal.

A folding amplifier typically has two internal amplifiers that are constantly turned on in a low power state. The dynamic gain of the folding amplifier is typically a function of the switching speed of the switching preamplifier between the various internal amplifiers as the input voltage changes. If the switching by the switching preamplifier between the various internal amplifiers is not accomplished before the hold phase of the input signal begins, the folding amplifier can supply a large transient output signal that is opposite in magnitude to the change in the input signal. This transient output signal will decrease the dynamic gain of the amplifier due to the increase in time it takes the amplifier to compensate and overcome the initial transient. The extra time required to compensate for the output transient signal is inversely proportional to the difference between the input signal and the second reference signal. Therefore a worst case scenario occurs when the input signal changes from a value near the first reference signal to a value near the second reference signal. In this worst case scenario, the time necessary to compensate for the transient condition can severely reduce the useful dynamic gain of the amplifier. This reduces the effectiveness of the folding amplifier in high-speed applications.

Therefore it would be desirable to provide a folding amplifier having a useful dynamic gain that is suitable for high-speed applications.

BRIEF SUMMARY OF THE INVENTION

A folding differential amplifier that includes a switching preamplifier that is used to select between first and second differential amplifiers as a function of an input signal. The switching preamplifier includes first and second outputs that are coupled together by a first shorting switch having an open phase and a closed phase. The first and second outputs are held at a steady state value during the closed phase of the shorting switch and allowed to vary during the open phase of the shorting switch. First and second differential amplifiers each have first and second outputs and the first output of the first differential amplifier is coupled to the second output of the second differential amplifier. Similarly, the second output of the first differential amplifier is coupled to the first output of the second differential amplifier. These cross coupled outputs form first and second amplifier outputs respectively. The first and second amplifier outputs can be coupled together by a second shorting switch having a closed phase and an open phase. The closed phase of the second shorting switch lasting longer than the closed phase of the first shorting switch.

In one aspect, the first and second outputs of the switching preamplifier are coupled to the first and second differential amplifiers via first and second current mirrors. The switching preamplifier programs the current available to each of the first and second differential amplifiers. A first and second bleeder current source can be used to provide a current level that allows the first and second differential amplifiers to be turned off when the current from the first and second differential amplifier plus the first and second bleeder current source respectively, is less than the current in of the first and second current mirrors respectively.

In another aspect a compensating current source and compensation differential amplifier are included with the switching preamplifier and the first and second differential amplifiers described above. The compensating current source provides a decaying current to the compensation differential amplifier during the open phase of the first and second shorting switches. The compensation differential amplifier includes first and second inputs and first and second outputs. The first and second outputs of the compensation differential amplifier are coupled to the first and second amplifier outputs and the first and second inputs of the compensation differential amplifier receive the first and second reference signals respectively.

Additional aspects, features and advantages of the present invention are also described in the following Detailed Description.

BRIEF DESCRIPTION OF THE SEVERAL VIEWS OF THE DRAWING

The invention will be more fully understood by reference to the following Detailed Description of the Invention in conjunction with the drawings of which.

DETAILED DESCRIPTION OF THE INVENTION

Figure 1:
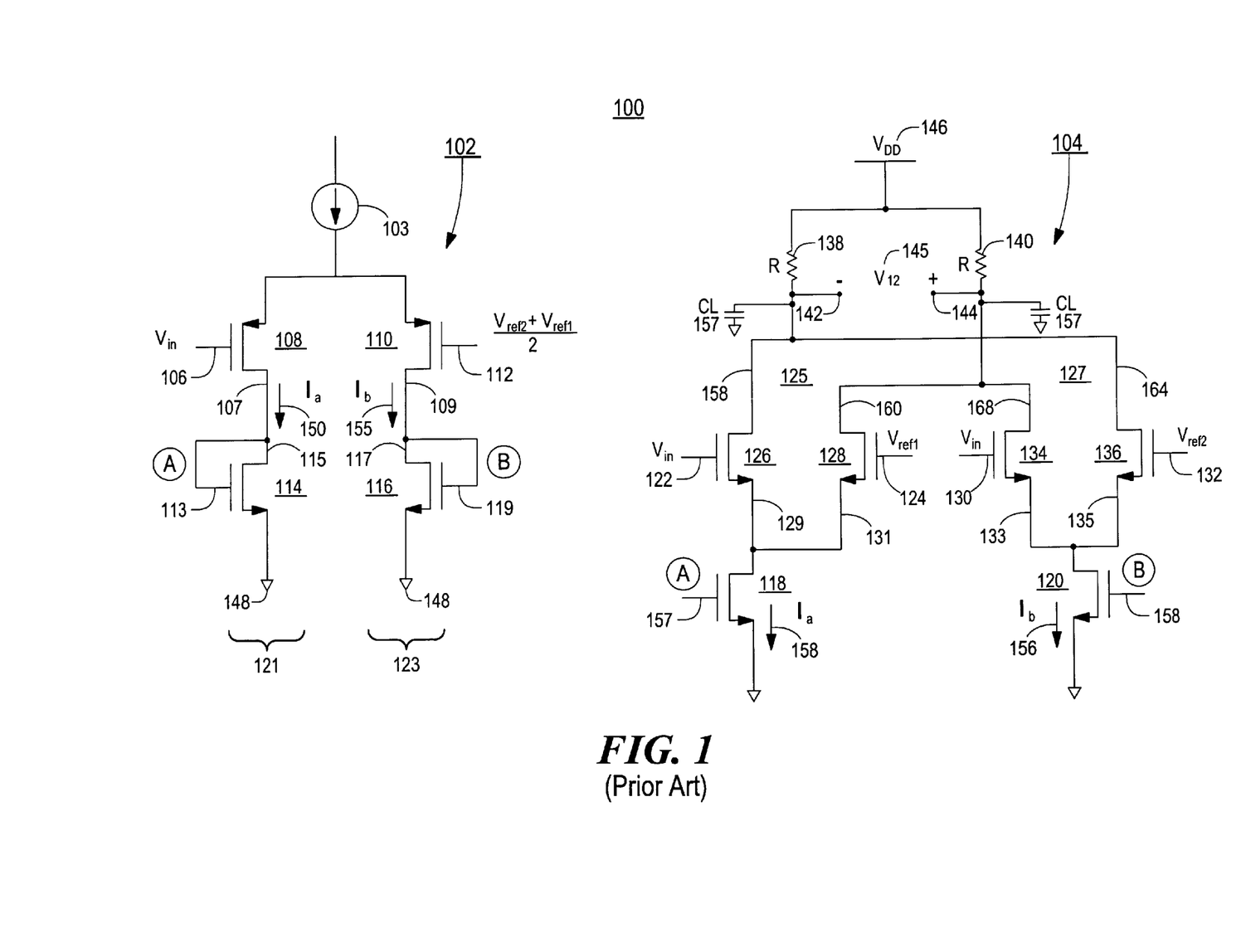
FIG. 1 is a schematic circuit diagram of a prior art folding amplifier.

FIG. 1 depicts a typical prior art folding amplifier 100 that includes a switching preamplifier 102 and an amplifier stage 104. A folding amplifier is typically used in analog-to-digital converters (ADCs) and provides a coarse but high speed range determination to reduce the processing necessary to convert an analog signal into a digital signal. A folding amplifier divides the input signal range into a plurality of segments, where each segment has a corresponding differential amplifier associated therewith to provide a slightly finer range resolution. An input signal is typically sampled and held, and a first determination of the input signal range is made. The differential amplifier associated with the determined signal range is selected and the range in which the input signal is in is further refined using at least one differential amplifier.

The switching preamplifier 102 includes a current source 103, which provides a current $I_0$, coupled to a pair of input transistors 108 and 110. The input transistors 108 and 110 receive inputs via gate leads 106 and 112 respectively. The inputs include a $V_{in}$ signal, the signal to be amplified, and a combination of first and second reference signals $V_{ref1}$ and $V_{ref2}$, which in the depicted embodiment is the arithmetic average of the first and second reference signals. The input transistors 108 and 110 are typically P-channel MOSFETS and are coupled via drainl 107 and 109 to the drain terminals 115 and 117 of transistors 114 and 116. Transistors 114 and 116 have their gate terminals, 113 and 119 respectively, also coupled to the drain terminals 115, 117. The difference between the input signal $V_{in}$ and the arithmetic average of the first and second reference signals (the reference signal average) determines the proportion of the current $I_0$ provided by the current source 103 that flows through each arm 121 and 123 of the switching preamplifier 102. The currents flowing in each arm 121 and 123 are shown as currents $I_A$ 150 and $I_B$ 155 respectively. For example, if $V_{in}$ is less than the arithmetic average of the first and second reference signals, a larger proportion of $I_0$ flows in current $I_A$ in arm 121. Similarly, if $V_{in}$ is greater than the arithmetic average of the first and second reference signals, a larger proportion of $I_0$ flows in current $I_B$ in arm 123. If the two input signals are equal to one another, currents $I_A$ and $I_B$ will equal $I_0/2$.

Amplifier 104 includes a voltage source 146 providing a VDD voltage that is coupled to a pair of high impedances R 138 and R 140. The high impedances R 138 and 140 can be provided by a large value resistor, an active load, or a current source. Nodes 142 and 144 form a differential output $V_{12}$ 145. R 138 and R 140 are each coupled to one each of the two pair of transistors that form a pair of differential amplifiers 125 and 127. C 157 represents the load capacitance $C_L$ of the next stage and any parasitic capacitances is connected to each output node 142 and 144. Thus, the output $V_{12}$ 145 is formed from a combination of current flowing to/from the two differential amplifiers 125 and 127 through the load capacitance C 157.

The first differential pair 125 includes a pair of transistors 126 and 128 coupled via their respective source terminals 129 and 131 to transistor 118. Gate terminal 157 of transistor 118 is coupled to node A of transistor 114 of the preamplifier 102 and forms a current mirror therewith, such that the drain current 148 of transistor 118 is equal to the current $I_A$ 150. The transistors 126 and 128 receive inputs of $V_{in}$ and $V_{ref1}$ respectively via their respective gate terminals 122 and 124. The drain terminal 158 of transistor 126 is coupled to the high impedance 138 and the drain terminal 160 of transistor 128 is coupled to the high impedance 140.

Similarly, differential amplifier 127 includes a pair of transistors 134 and 136 coupled via their respective source terminals 133 and 135 to transistor 120. Gate terminal 158 of transistor 120 is coupled to node B of transistor 116 of the preamplifier 102 and forms a current mirror therewith, such that the drain current 156 of transistor 120 is equal to current $I_B$ 152. The transistors 134 and 136 receive inputs of $V_{in}$ and $V_{ref2}$ respectively via their respective gate terminals 130 and 132. The drain terminal 162 of transistor 134 is coupled to the high impedance 140 and the drain terminal 164 of transistor 136 is coupled to the high impedance 138.

The proportional currents $I_A$ 150 and $I_B$ 155 formed in the switching preamplifier 102 program the maximum amount of current provided by each differential amplifier 125 and 127 to the output $V_{12}$ 145. Because the output from each differential pair 125 and 127 is a current provided to/from a capacitive load $C_L$ 157, the differential output voltage developed at node $V_{12}$ 145 is equal to the integral of the differential output current divided by the load capacitance $C_L$ 157.

Figure 2:
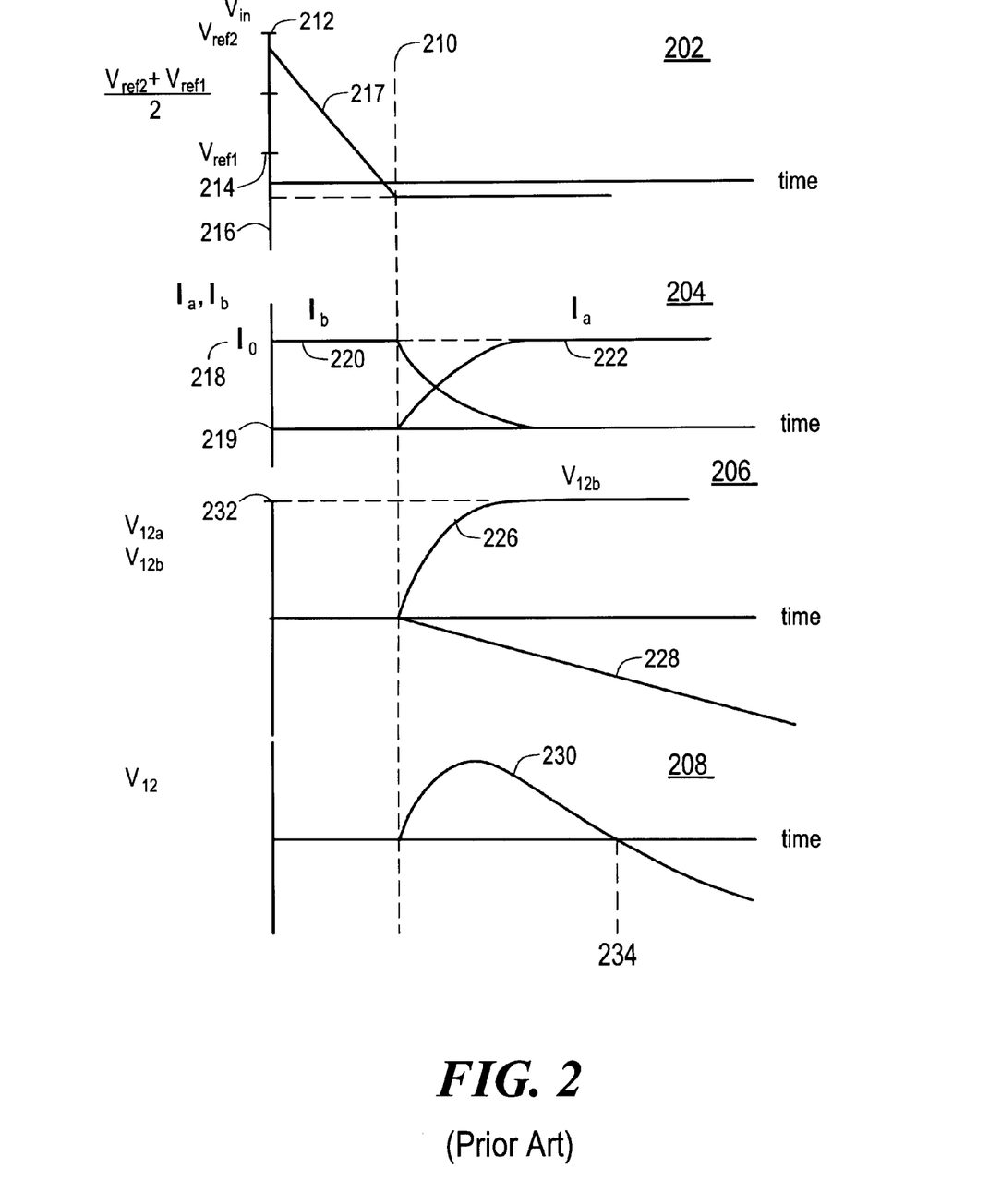
FIG. 2 is a plurality of graphs illustrating the operation of the circuit depicted in FIG. 1.

FIG. 2 depicts a series of graphs of voltages and currents versus time at various nodes in the circuit depicted in FIG. 1. Graph 202 depicts one example of the input voltage $V_{in}$ decreasing from slightly less than $V_{ref2}$ to a value less than $V_{ref1}$, where $V_{ref1}$ is less than $V_{ref2}$, at which the input signal $V_{in}$ is held until the subsequent sampling period. Typically in these amplifiers the input is allowed to vary during a sampling period and then is held constant during a hold period. In the illustrated plots the time 210 is the beginning of the hold phase of the input. At this time the input voltage 117 instantly changes to the value 216. As illustrated in graph 204 the current $I_B$ 220 has an initial value 218 that is approximately $I_0$ when the signal $V_{in}$ is greater than the average of the reference signals. After the signal $V_{in}$ has changed and is held at time 210 at a point lower than $V_{ref1}$ the currents $I_A$ 222 and $I_B$ 220 will also change reflecting the change in the input signal. Current $I_B$ 220 will exponentially decay to a value 219 that is approximately zero and current $I_A$ 222 will exponentially increase to a value 218 that is approximately $I_0$. In the illustrated embodiment, the transistors 108 and 110 in the switching preamplifier 102 are matched such that the currents $I_A$ 222 and $I_B$ 220 change in approximately the same time period as depicted in FIG. 2. The change in the currents $I_A$ 222 and $I_B$ 220 will change the currents through the pair of differential amplifiers 125 and 127 in FIG. 1 as described above. When Vin is less than Vref1 and Vref2 the transistors 128 and 136 will both conduct and draw current.

The graph 206 depicts the component of the differential output voltage $V_{12}$ 145 provided by differential amplifier 127, as curve 226, and the component of the differential output voltage $V_{12}$ 145 provided by differential amplifier 125 as curve 228. As the current $I_B$ provided by the differential pair 127 is reduced, the component of the output voltage $V_{12}$ 145 depicted in curve 206 increases to a steady state value 232 and levels off. This is expected since the output voltage $V_{12}$ is the integral of the differential output current $I_B$ divided by the load capacitance 157. In this instance, the output current $I_B$ has an initial value greater than zero and then exponentially decays. As the differential output current $I_A$ from the differential pair 125 exponentially increases to a steady state value 218 the output voltage $V_{12}$ 145 as depicted in graph 228 becomes a negative ramp. This is expected since the current $I_A$ depicted as curve 222 increases to a steady state value. The superposition of these two differential voltages forms the combined differential output voltage $V_{12}$ 145 shown in graph 208.

As depicted in graph 208, an initial positive transient pulse 230 begins to decrease, and after time 234 becomes a negative ramp. Thus, the current $I_B$ that is the initial condition of the differential amplifier 127 is integrated as it decays by the load capacitance $C_L$ 157 and causes the initial transient output pulse. In contrast, the desired differential output current that is provided by the differential amplifier 125 has an initial condition near zero and requires a period of time to reach the steady state value. In the time period 211 the current $I_B$ provided by the differential amplifier 127 fights the current $I_A$ provided by the differential amplifier 125 resulting in an undesirably long settling time. Although not shown in FIG. 2, this fighting also occurs when the currents $I_A$ and $I_B$ switch in the opposite directions, i.e., when $I_A$ goes to zero and $I_B$ goes to $I_0$.

Figure 3:
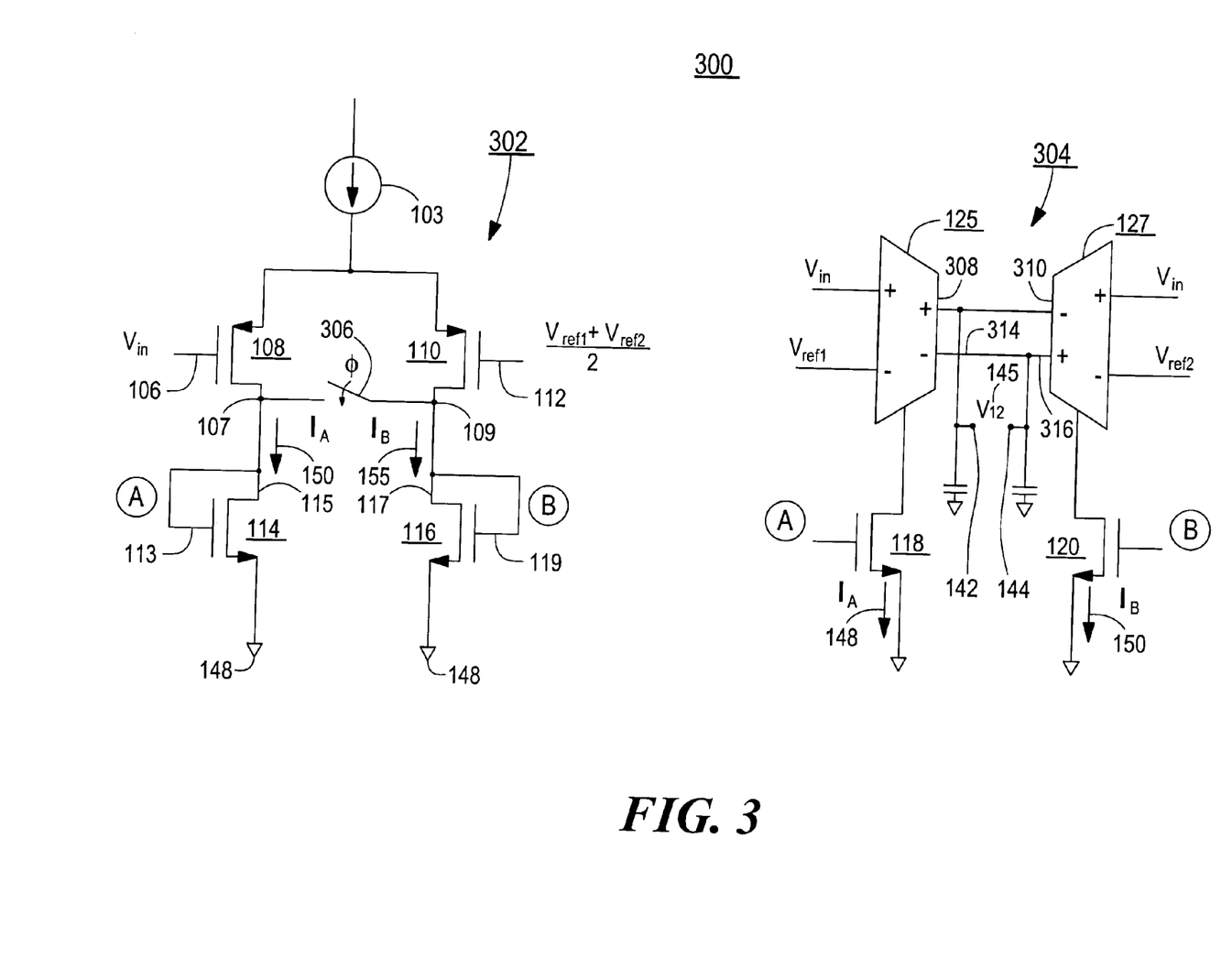
FIG. 3 is a schematic circuit diagram of one embodiment of a folding amplifier in accordance with the present invention.

FIG. 3 illustrates one embodiment of a folding amplifier that will reduce the "fighting" between the output current of the pair of differential amplifiers when a large change in the input signal occurs. The amplifier 300 includes a switching preamplifier 302 and an amplifier stage 304. The switching preamplifier 302 is similar to the switching preamlifier 102 depicted in FIG. 1 with the addition of a shorting switch 306. Shorting switch 306 includes a closed phase φ and an open phase. The operation of the switching preamplifier 302 is as described above, with the addition that during the closed phase φ, the switch 306 electrically connects the two drain terminals 107 and 109 together in a short circuit. The closed phase φ of the shorting switch 306 coincides with the sample period of the input and the open phase of the shorting switch 306 coincides with the hold period of the input. This causes the current $I_A$ 150 and $I_B$ 152 to be equal to $I_0/2$ during the closed phase φ of the switch 306.

The amplifier 300 also includes differential amplifiers 125 and 127 which are shown as blocks from which the details of FIG. 2 are omitted. The differential amplifiers 125 and 127 are coupled to the switching preamplifier 302 via current mirror transistors 118 and 120. In the illustrated embodiment, the positive output 308 of the first differential amplifier 125 is connected to the negative output 310 of the differential amplifier 127. Similarly, the negative output 314 of the first differential amplifier 125 is connected to the positive output 316 of the differential amplifier 127. The operation of the differential amplifiers 125 and 127 is as described above with reference to FIG. 1. The initial condition of each of the differential amplifiers 125 and 127 are different than the prior art amplifier depicted in FIG. 1. In particular, because the current $I_A$ and $I_B$ are equal to $I_0/2$ during the closed phase φ, the initial magnitude of the integrated current $I_B$ is less than in the prior art circuit, and the time required for $I_B$ to exponentially decay is less than in the prior art circuit as well. Similarly, because the current $I_A$ is $I_0/2$ during the closed phase φ, the initial magnitude of the integrated current $I_A$ is greater than the prior art circuit, and the rise time required for $I_A$ to rise to the steady state value is less than the prior art circuit as well.

Figure 4:
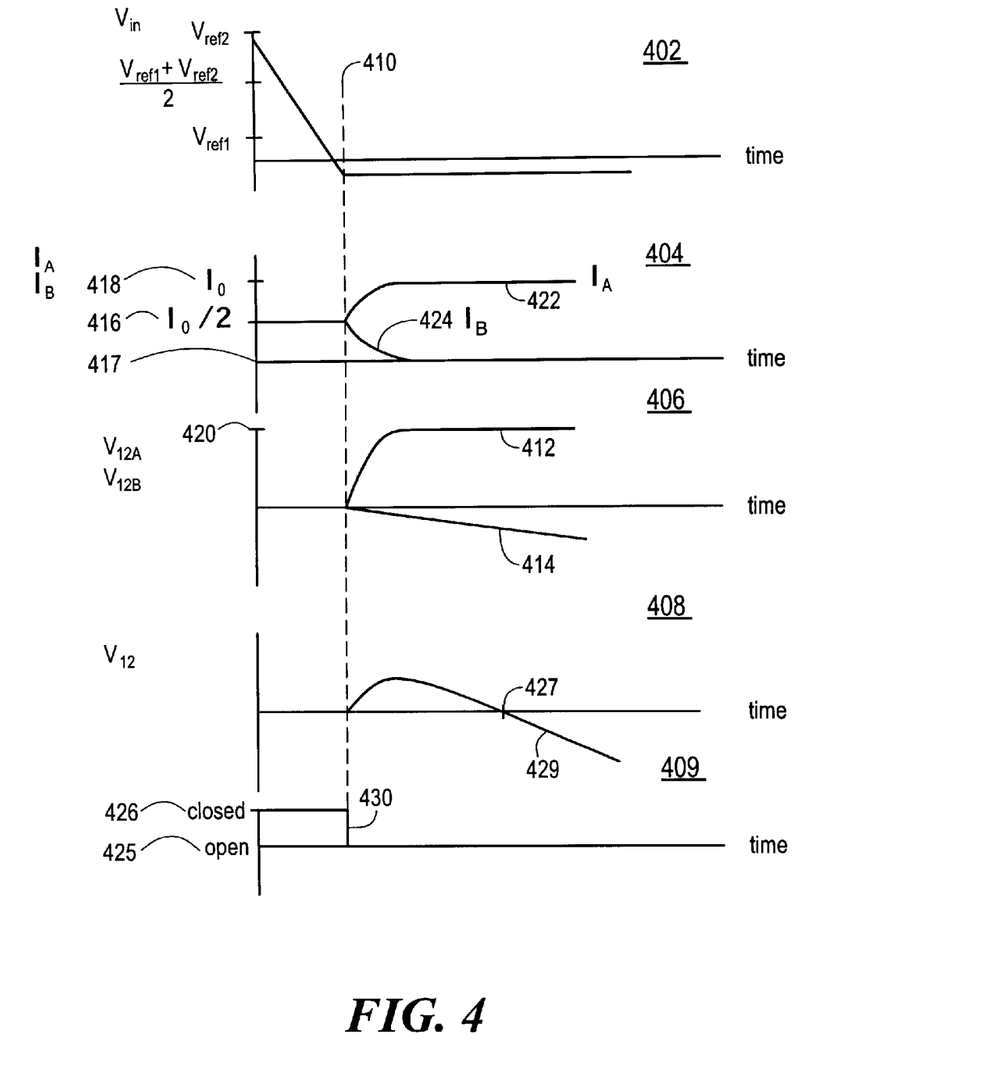
FIG. 4 is a plurality of graphs illustrating the operation of the circuit depicted in FIG. 3.

FIG. 4 illustrates the effect of the switch 306 on the operation of the circuit depicted in FIG. 3. Graph 402 illustrates the input signal $V_{in}$ over time. The time 410 represents the beginning of the hold period of the input signal $V_{IN}$ for the amplifier. As illustrated in graph 409, the shorting switch 306 is in the closed phase φ 426 until time 410, at which time the shorting switch enters the open phase 425 allowing the switching amplifier 302 to operate. Graph 404 shows the currents $I_A$ and $I_B$ of the switching preamplifier. When the shorting switch 306 is closed prior to time 410, the two currents $I_A$ and $I_B$ are equal to $I_0/2$. After the input is held and the switch 306 opens at time 410, each of the two currents $I_A$ and $I_B$ changes in a manner reflecting the change in the input signal. Current $I_B$ decays exponentially to nearly zero and current $I_A$ increaseS exponentially to nearly $I_0$. However, because the magnitude of each current $I_A$ and $I_B$ changes by $I_0/2$ and not $I_0$ they require less time to reach their respective steady state values. Hence, the decay time of $I_B$ and the rise time of $I_A$ are less than that of the switching preamplifier 102 illustrated in FIG. 1.

Graph 406 depicts the two components of the output voltage $V_{12}$ 145 in amplifier 302 of FIG. 3. Curve 412 depicts the component of the differential output voltage provided by differential amplifier 125, $V_{12A}$, and curve 414 depicts the component of the differential output voltage $V_{12b}$ provided by differential amplifier 127 $V_{12B}$. As depicted in graph 412, after the voltage $V_{in}$ is held at time 410 for processing, the differential output voltage $V_{12A}$ provided by differential amplifier 127 climbs to a value 420. Similarly, as depicted in graph 414 the differential output voltage provided by differential amplifier 125 is a negative going ramp voltage. The output voltage $V_{12}$ 145 that is the superposition of these two signals, as depicted in graph 408, has a smaller positive going transient pulse, and therefore a shorter settling time for the amplifier 300 than the prior art folding amplifiers. Thus, this embodiment may be used at higher sampling speeds than the prior art circuit depicted in FIG. 1.

Figure 5:
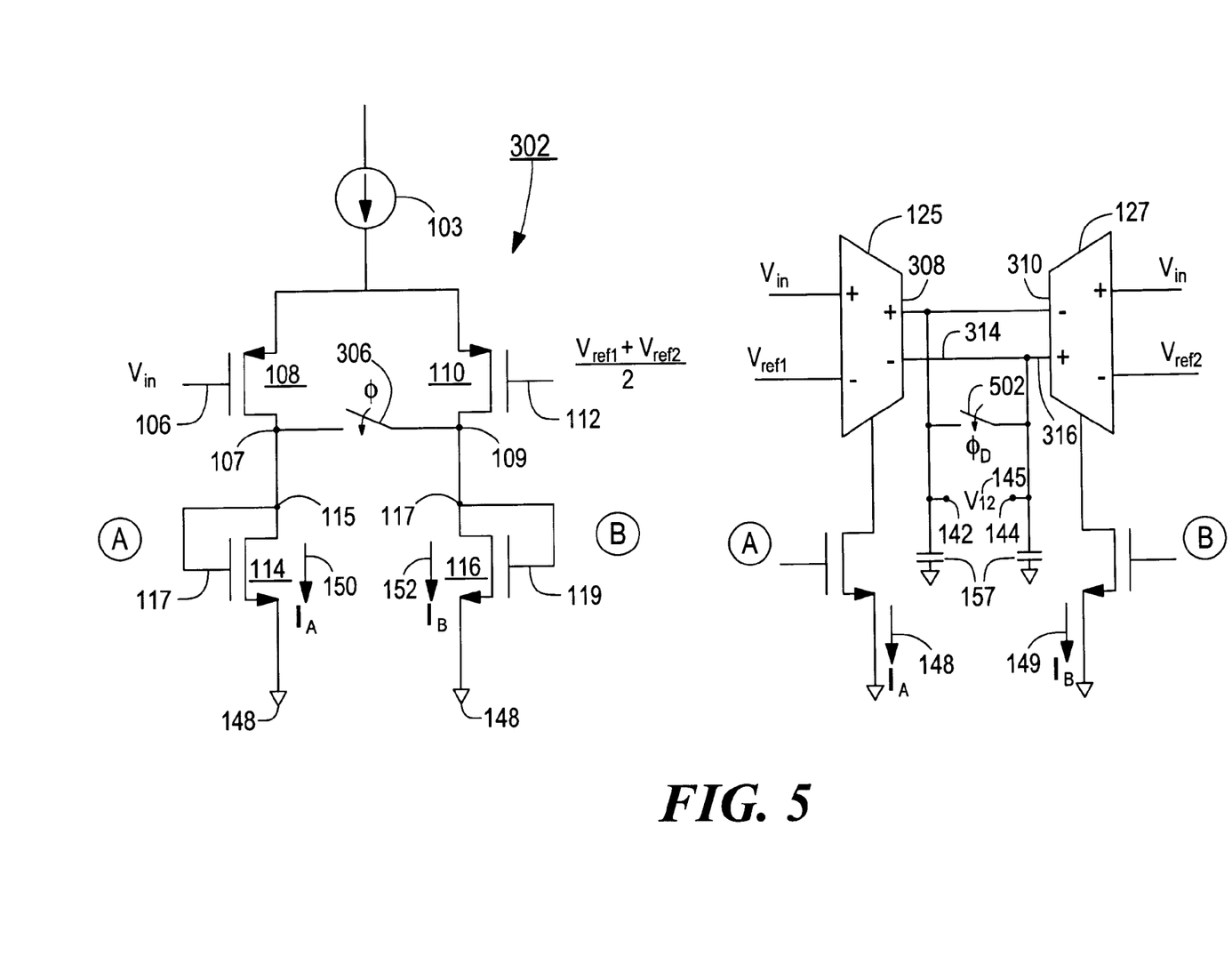
FIG. 5 is a schematic circuit diagram of another embodiment of a folding amplifier in accordance with the present invention.

FIG. 5 depicts another embodiment of the present invention. The switching preamplifier 302 operates as described above with reference to FIG. 3. The pair of differential amplifiers 125 and 127 operate as described above with reference to FIG. 3, with the addition of a shorting switch 502 that electrically connects the outputs of the differential amplifiers 125 and 127 together during a closed phase $φ_D$. Because the outputs of the differential amplifiers 125 and 127 are electrically connected during the closed phase $φ_D$ of the switch, there can be no differential output voltage while the shorting switch is closed. In the illustrated embodiment, the closed phase $φ_D$ of shorting switch 502 extends longer than the closed phase φ of shorting switch 306 and therefore beyond the beginning of the hold phase of the input. When the switch 502 is opened at a time delayed after the switch 306 has opened, the switching preamplifier 302 has been switching currents $I_A$ and $I_B$ since the beginning of the hold phase of the input. In this way, currents $I_A$ 150 and $I_B$ 152 have been approaching their final steady state values during the time that the shorting switch 502 has been closed. Therefore when the shorting switch 502 is opened, the current $I_B$ 152 has decayed longer than the amplifier illustrated in FIG. 1 and is smaller in magnitude. Since the output current that is integrated by the load capacitance $C_L$ 157 is a function of $I_B$, the component of the differential output voltage provided by the differential amplifier 127 will be smaller than in the circuit illustrated in FIG. 1. Therefore, delaying the opening of the shorting switch 502 further reduces the effect of any transient conditions with respect to the prior art depicted in FIG. 1 and the first embodiment illustrated in FIG. 3.

Figure 6:
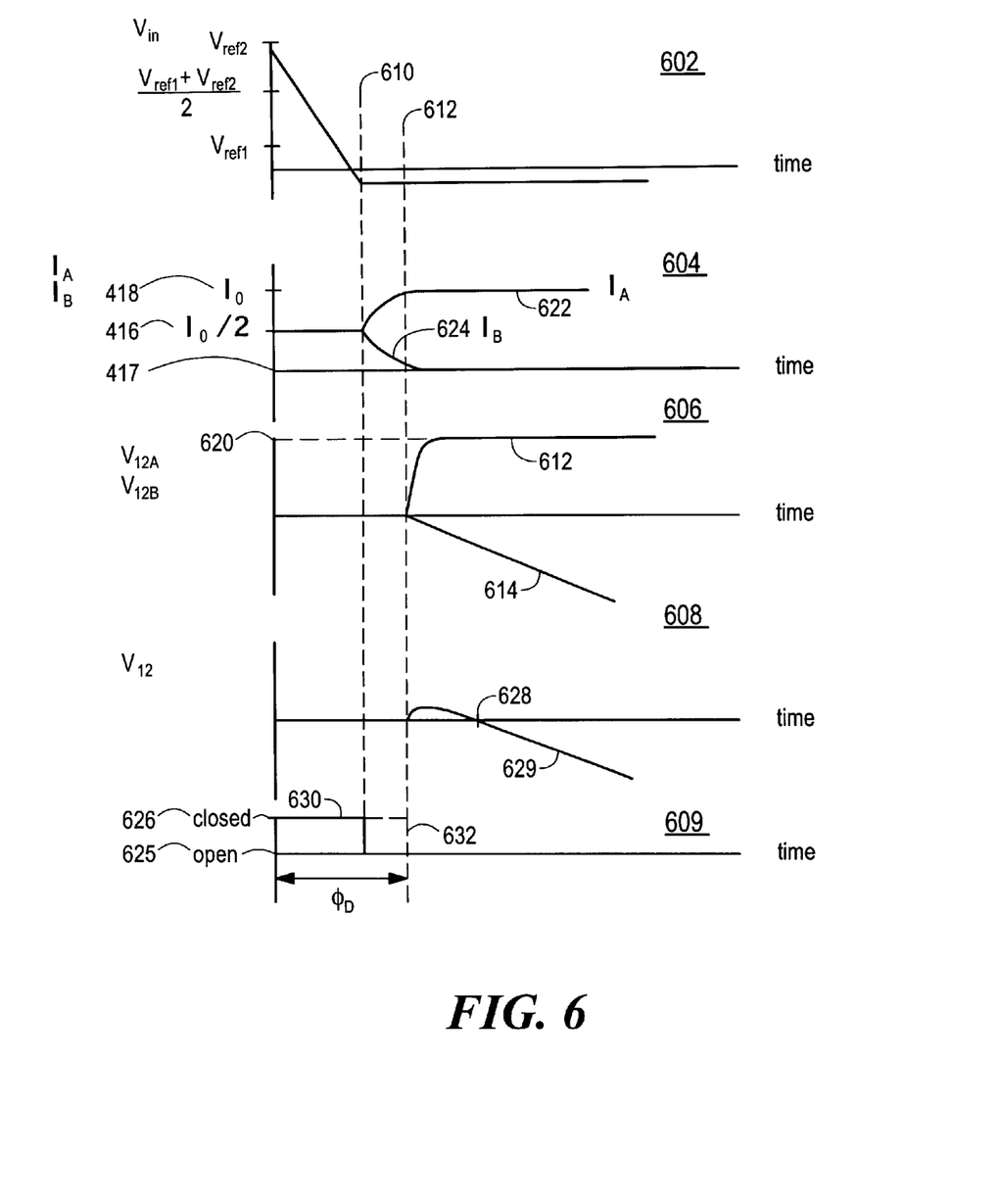
FIG. 6 is a plurality of graphs illustrating the operation of the circuit depicted in FIG. 5.

The operation of the circuit depicted in FIG. 5 is illustrated in FIG. 6. Graphs 602 and 604 are identical to graphs 402 and 404 depicted in FIG. 4. Graph 609 illustrates the closed phase 630 of the shorting switch 306 in the switching preamplifier 302 that opens at time 610, and also illustrates the closed phase 632 of the shorting switch 502 that opens at time 612, that is time delayed after time 610.

Graph 606 depicts the two components of the differential output voltage $V_{12}$ 145 in amplifier 302 of FIG. 3. Curve 612 depicts the component of the differential output voltage, $V_{12B}$, provided by differential amplifier 127 and curve 614 depicts the component of the differential output voltage, $V_{12A}$, provided by differential amplifier 125. Switch 502 is closed until time 612, shorting the nodes 142 and 144 and reducing the differential output voltage provided by each differential amplifier 125 and 127 to zero. Thus, there is no differential voltage $V_{12}$ 145 until time 612. At time 612, switch 502 opens and the output voltage $V_{12}$ changes in response to the input voltage value. As noted above, the final steady state value 620 of curve 612 is smaller than in the prior art circuits, because the transient time period is shorter and the current $I_B$, depicted in graph 604 as curve 624, has decayed further during the delay time. The time delay between opening switch 306 and switch 502 allows the currents $I_B$ to decay and the current $I_A$ to increase for the additional time provided by the time delay. This delay time therefore not only reduces the transient period by the time between the opening of shorting switch 306 and shorting switch 502 but also reduces the time during which the currents $I_A$ and $I_B$ are integrated as they approach their steady state values. This effect can be seen in graph 608, in which the positive going pulse in the output V12 145 depicted by graph 629 is much smaller than in the prior art circuits and the output tracks voltage $V_{12}$ the negative going curve 614 much faster. This allows the embodiment depicted in FIG. 5 to be used with faster sampling times than the prior art.

Figure 7:
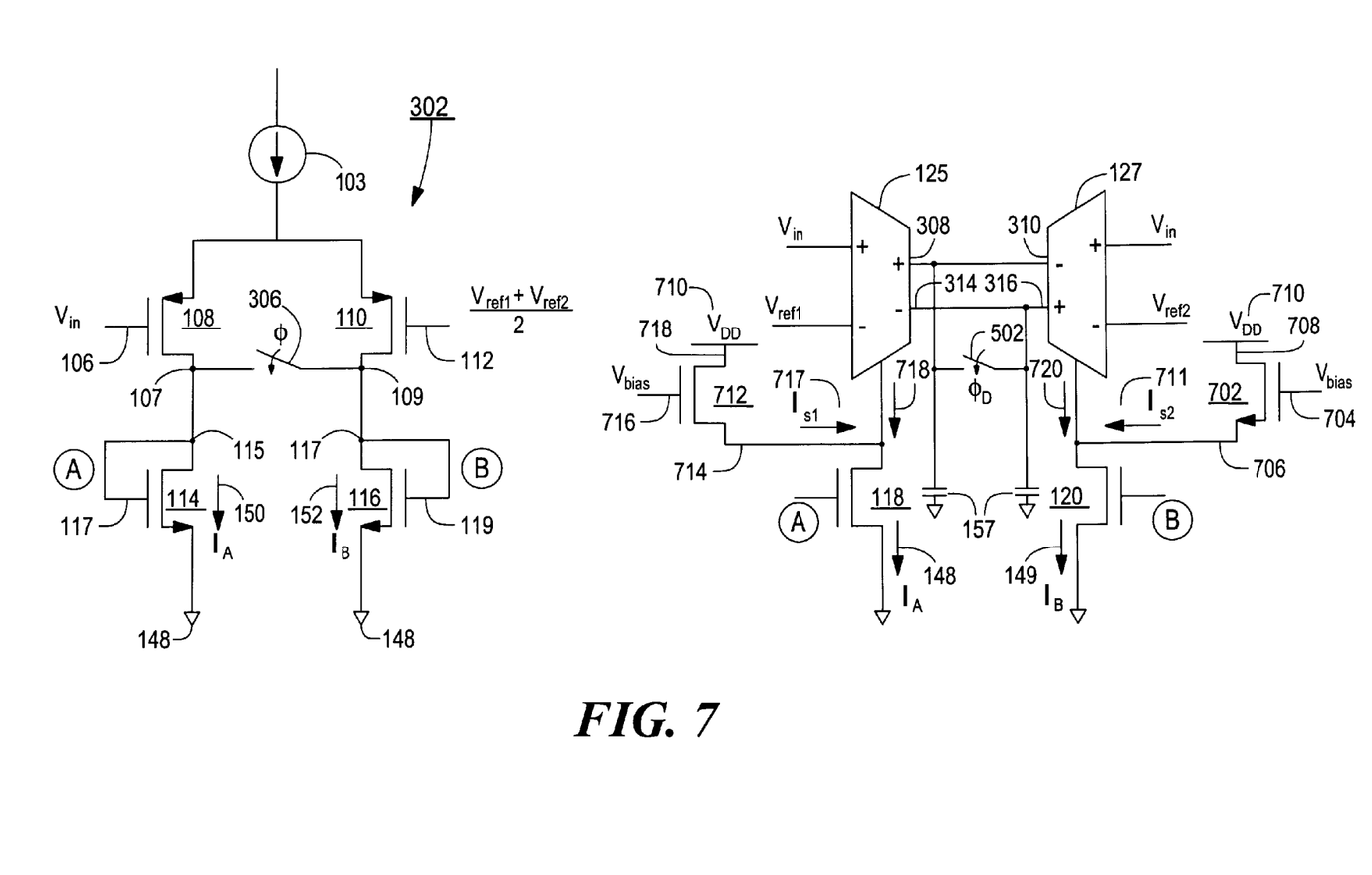
FIG. 7 is a schematic circuit diagram of another embodiment of a folding amplifier in accordance with the present invention.

FIG. 7 illustrates another embodiment of the present invention. This embodiment is identical to the embodiment illustrated in FIG. 5 with the addition of two transistors 712 and 702 that provide an additional current to the current mirror transistors 118 and 120 to reduce the current at which each of the differential amplifiers 125 and 127 turns off.

The transistors 712 and 702 are N-channel MOSFETs configured as current sources in which the drain terminals 718 and 708 respectively are connected to the voltage source 710 providing VDD voltage. The gate terminals of each transistor 712 and 702, 716 and 704 respectively, are connected to a voltage bias source $V_{bias}$ 716 and 704 respectively, to set the drain currents $I_{s2}$ 717 and $I_{s2}$ 711. These drain currents $I_{s1}$ 717 and $I_{s2}$ 711 are provided to the drain terminals of the current mirror transistors 118 and 120. In this way, the current $I_A$ mirrored in the current mirror transistors 118 is equal to the sum of the current $I_{s1}$ plus the drain current 718. Similarly, the current $I_B$ mirrored in the current mirror transistors 120 is equal to the sum of the current $I_{s2}$ plus the drain current 720. This will provide an even earlier cutoff to either of the differential amplifiers 125 and 127 since the drain currents 718 or 720 must only decay to a value of $I_A-I_{s1}$ or $I_B-I_{s2}$ respectively.

Figure 8:
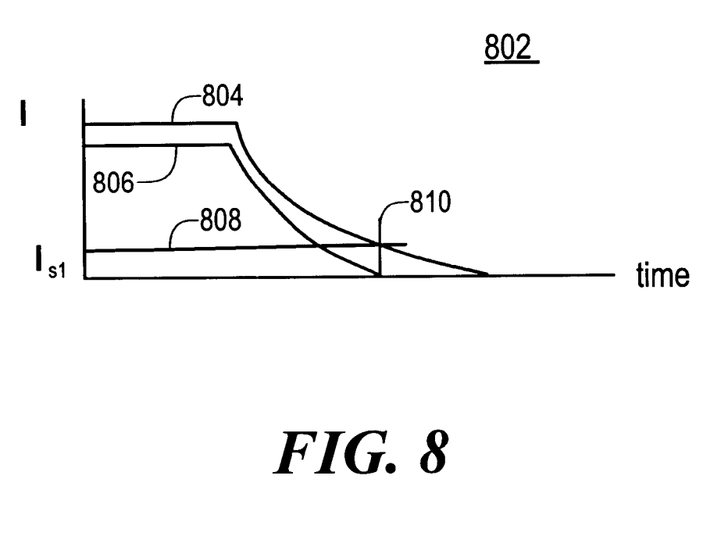
FIG. 8 is a plurality of graphs illustrating the operation of the circuit depicted in FIG. 7.

This effect is illustrated in FIG. 8. In graph 802, curve 804, depicts the current $I_A$, or $I_B$, curve 806 depicts the drain current 718 or 720 respectively, and curve 808 depicts the current $I_{s1}$ or $I_{s2}$ respectively. Because of the summation of currents, the current $I_{s1}$ will always be a constant $I_s$ level below the current $I_A$. Thus, when the current $I_A$ reaches the value of $I_s$ at time 810, the differential amplifier will be cut off since the current from the differential amplifier has reached zero. Thus, the transient period of the differential amplifier providing the positive going pulse will be reduced over the prior art.

Figure 9:
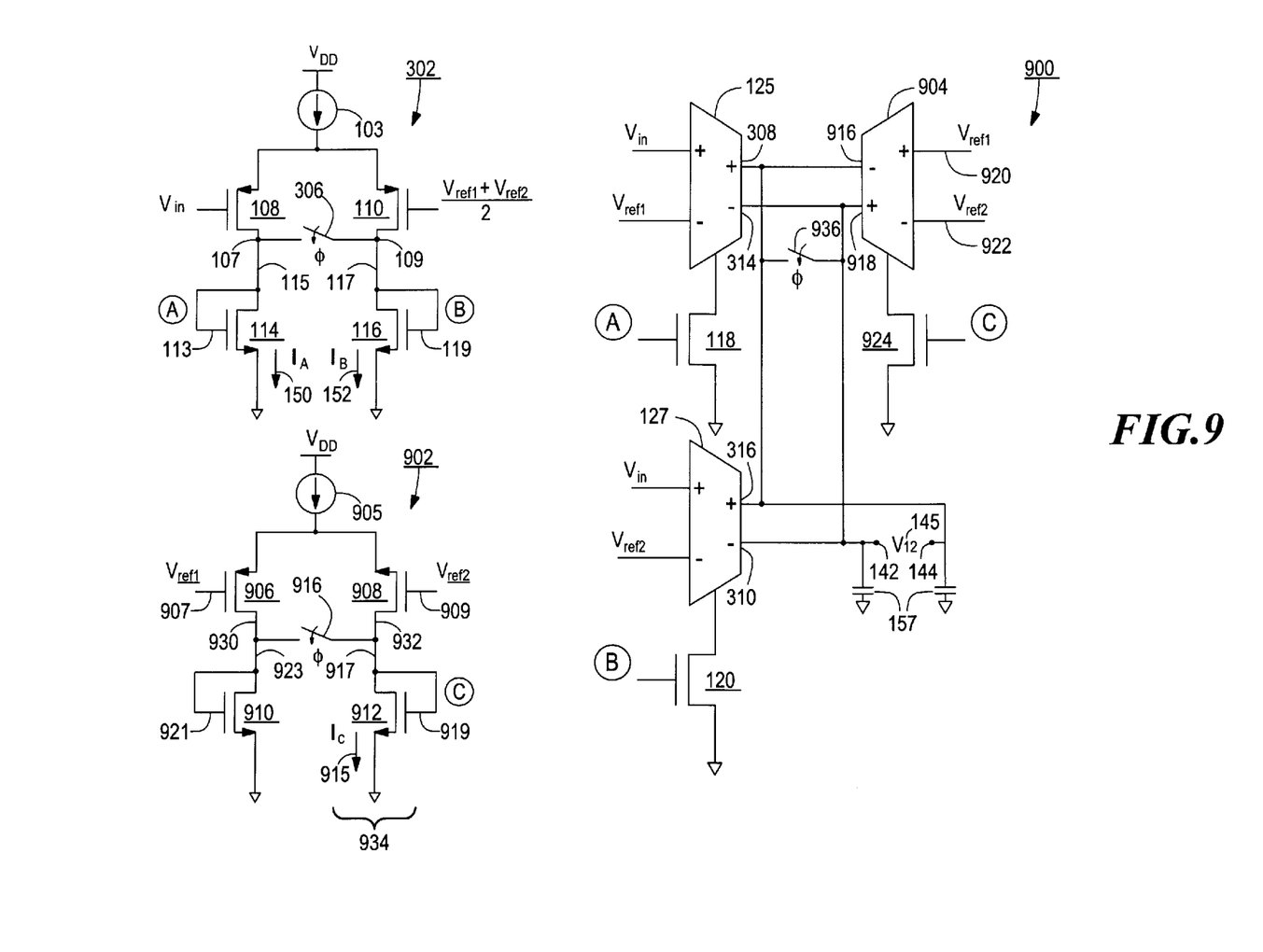
FIG. 9 is a schematic circuit diagram of another embodiment of a folding amplifier in accordance with the present invention.

FIG. 9 illustrates another embodiment of a high speed folding amplifier consistent with the present invention. A switching preamplifier 302, which operates as described with respect to FIG. 3 is provided. A similar switching preamplifier 902 is also provided. The switching preamplifier 902 is configured and arranged to act as a current source that provides a decaying current 915. The switching preamplifier 902 includes a current source 905 coupled to two input transistors 906 and 908. The input transistors 906 and 908 receive inputs via the respective gate terminals 907 and 909. The gate terminals 907 and 909 receive the two inputs of $V_{ref1}$ and $V_{ref2}$ respectively, wherein $V_{ref1}$ is less than $V_{ref2}$ in the illustrated embodiment. The input transistors 906 and 908 are typically P-channel MOSFETS and are coupled via the respective drain terminals 930 and 932 to the drain terminals 923 and 917 respectively of transistors 910 and 912. Transistors 910 and 912 also have their respective gate terminals 921 and 919 coupled to the drain terminals 923 and 917 respectively. A shorting switch 914 is provided that has the same closed phase φ as the shorting switch 306 in the switching preamplifier 302. Because $V_{ref1}$ is less than $V_{ref2}$, the current $I_C$ 915 flowing in arm 934 of the switching prearnplifier 902 will always decay. When the switching preamplifier 302 and the stitching preamplifier 902 are constructed from maatching semiconductor devices, as the input voltage $V_{in}$ changes as described above, the currents $I_B$ and $I_C$ will decay in substantially the same way and in substantially the same time period.

As depicted in FIG. 9, differential amplifier 125 and 127 are configured and operate as described with respect to FIG. 3. An additional compensation differential amplifier 904 is added to this configuration, wherein the positive output 916 of differential amplifier 904 is connected to the positive output 308 of differential amplifier 125 and the negative output 310 of the differential amplifier 127. Similarly, the negative output 918 of differential amplifier 904 is connected to the negative output 314 of differential amplifier 125 and the positive output 316 of the differential amplifier 127. The differential amplifier 904 includes a pair of inputs 920 and 922 that receive the signals $V_{ref1}$ and $V_{ref2}$ respectively, wherein as noted above, $V_{ref1}$ is less than $V_{ref2}$. In addition, the current flowing through the differential amplifier 904 is programmed by the transistor 924 that forms a current mirror with transistor 912 in the switching preamplifier 902.

As noted above, when the shorting switch 914 opens, the current $I_C$ 915 decays. A shorting switch 936 having the same closed phase φ as the shorting switch 306 and the shorting switch 914 is provided between the output nodes 142 and 144. When the shorting switch 914 opens, the current $I_C$ 915 begins to decay, the current available to the differential amplifier 904 is reduced. In addition, the inputs $V_{ref1}$ and $V_{ref2}$ to the differential amplifier 904 are such that the differential output current that is integrated by the load capacitance $C_L$ 157 is negative, resulting in a negative differential voltage. The current $I_C$ 915 decays at the same rate as $I_B$ 152 and the inputs to differential amplifiers 904 and 127 are effectively equal and opposite. Therefore, the component of the differential output voltage $V_{12}$ 145 produced by integrating the differential output current provided by differential amplifier 127 is offset and effectively canceled by the component of the differential output voltage $V_{12}$ 145 produced by integrating the differential output current produced by differential amplifier 904. In this way, there will be substantially no transient positive going pulse at the output so that the differential output $V_{12}$ 145 tracks the input signal $V_{in}$ with little or no delay.

Figure 10:
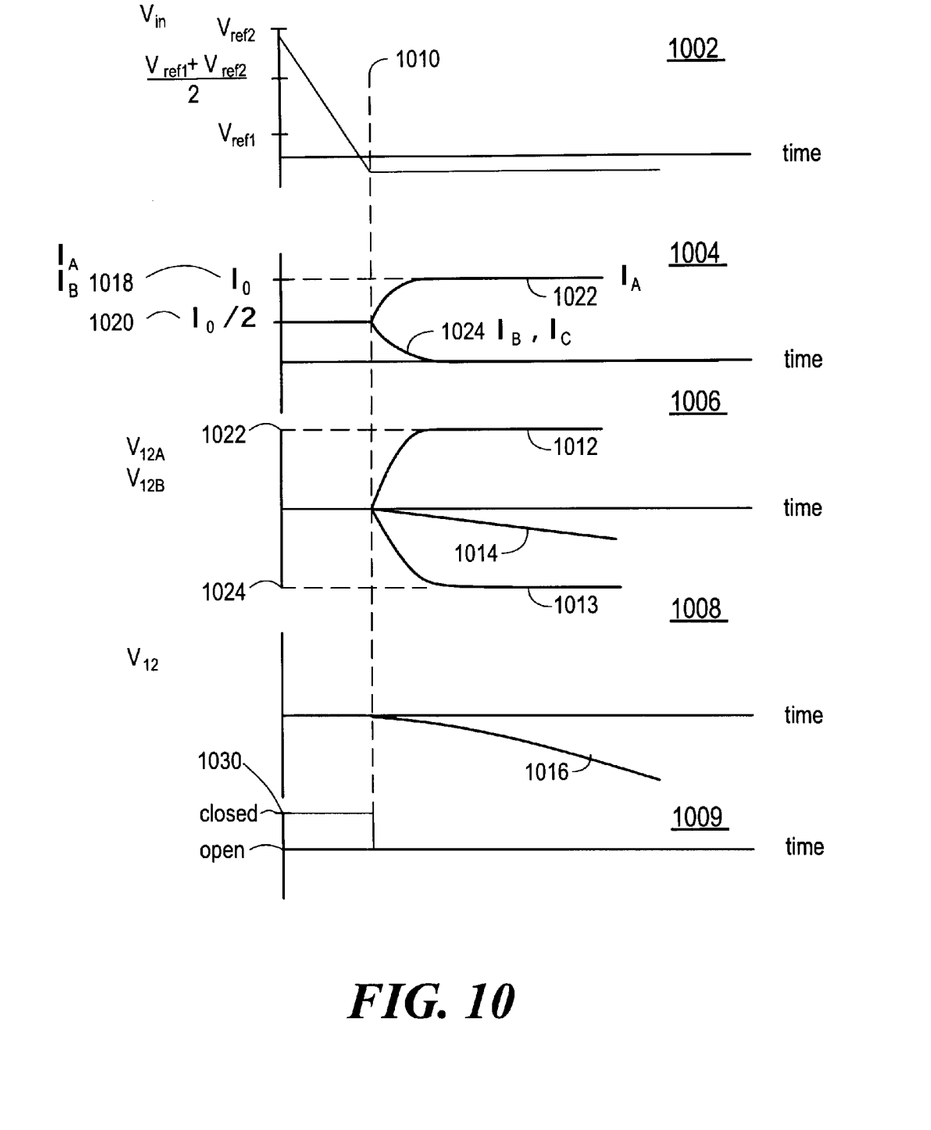
FIG. 10 is a plurality of graphs illustrating the operation of the circuit depicted in FIG. 9.

The operation of the circuit depicted in FIG. 9 is illustrated in FIG. 10. FIG. 10 depicts a plurality of graphs representing various voltages and currents in the embodiment depicted in FIG. 9. Graphs 1002 and 1004 are identical to graphs 402 and 404 depicted in FIG. 4 and described therein with the addition of current $I_C$. As can be seen, current $I_C$ decays in the same manner in the same time period as current $I_B$. Graph 1009 illustrates the closed phase 1030 of the shorting switches 306, 914, and 936 that opens at time 1010.

Graph 1006 depicts the three components of the output voltage $V_{12}$ 145. Curve 1012 depicts the differential output voltage provided by the differential amplifier 125, curve 1014 depicts the differential output voltage provided by the differential amplifier 125, and curve 1013 depicts the differential voltage provided by the differential amplifier 904. Curve 1012 has a maximum value 1022 that is equal to but of opposite polarity of the maximum value 1023 of curve 1013. In this way, the differential amplifier 904 is used to cancel the positive going transient pulse generated by the differential amplifier 127. As can be seen in graph 1009, the differential output of the folding amplifier 900 is seen to track the output of the differential amplifier 125, which as noted above, is the integral of the input voltage shown in graph 1002 after time 1010, and is a negative ramp. This allows the embodiment depicted in FIG. 9 to be used with a much faster sampling time than the prior art.

Those of ordinary skill in the art should further appreciate that variations to and modification of the above-described methods and apparatus for a folding amplifier may be made without departing from the inventive concepts disclosed herein. Accordingly, the invention should be viewed as limited solely by the scope and spirit of the appended claims.

What is claimed is:

1. A folding amplifier comprising:
   a switching preamplifier having first and second inputs and first and second outputs, the first input receiving an input signal, and the second input receiving a signal that is a combination of first and second reference signals;
   a shorting switch connected between the first and second outputs of the switching preamplifier, the shorting switch having a closed phase wherein the first and second outputs of the switching preamplifier are electrically connected together and an open phase wherein the first and second outputs of the switching preamplifier are not electrically connected by the shorting switch;
   first and second differential amplifiers, each having first and second inputs and first and second outputs, the first and second outputs of the first differential amplifier electrically connected to the second and first outputs respectively of the second differential amplifier forming first and second amplifier outputs respectively, wherein a differential output signal is formed as the difference between the first and second amplifier outputs;
   the first input of the first differential amplifier and the first input of the second differential amplifier receiving the input signal, the second input of the first differential amplifier receiving the first reference signal and the second input of the second differential amplifier receiving the second reference signal; and
   the first output of the switching preamplifier coupled to the first differential amplifier and the second output of the switching preamplifier coupled to the second differential amplifier, wherein the switching preamplifier, via the first and second outputs, selects the contribution of the first and second differential amplifiers to the differential output as a function of the difference between the input signal and the combination of the first and second reference signals.

2. The apparatus of claim 1, wherein the shorting switch is a first shorting switch and further including:
   a second shorting switch connected between the first and second amplifier outputs, the second shorting switch having a closed phase wherein the first and second amplifier outputs are electrically connected together and an open phase wherein the first and second amplifier outputs are not electrically connected by the shorting switch, wherein the open phase of the second shorting switch begins after the open phase of the first shorting switch has occurred.

3. The folding amplifier of claim 1 wherein the switching preamplifier comprises:
   a current source;
   first and second MOS transistors, each having a source lead, a gate lead, and a drain lead;
   the drain lead of the first and second MOS transistors coupled to the current source, the gate lead of the first MOS transistor receiving the input signal, and the gate lead of the second MOS transistor receiving the combination of the first and second reference signals;
   third and fourth MOS transistors, each having a source lead, a gate lead, and a drain lead;
   the source lead of the first MOS transistor coupled to the source lead and the gate lead of the third MOS transistor;
   the source lead of the second MOS transistor coupled to the source lead and the gate lead of the fourth MOS transistor;
   the drain lead of the third and fourth MOS transistor coupled to a third reference voltage; and
   wherein the first output of the switching preamplifier is a first drain current in the third MOS transistor and the second output of the switching preamplifier is a second drain current in the fourth MOS transistor.

4. The folding amplifier of claim 3 wherein the first shorting switch is coupled to the source lead of the third MOS transistor and the source lead of the fourth MOS transistor.

5. The folding amplifier of claim 3 wherein the first output of the switching amplifier is coupled to the first differential amplifier via a fifth MOS transistor having a source lead, a gate lead, and a drain lead, wherein the gate lead of the fifth MOS transistor is electrically coupled to the gate lead of the third MOS transistor forming a first current mirror; and
   wherein the second output of the switching amplifier is coupled to the second differential amplifier via a sixth MOS transistor having a source lead, a gate lead, and a drain lead, wherein the gate lead of the sixth MOS transistor is electrically coupled to the gate lead of the fourth MOS transistor forming a second current mirror, wherein the first and second current mirrors program the current available to the first and second differential amplifiers and thereby select the proportion of the differential output signal provided therefrom.

6. The folding amplifier of claim 5 further including a first bleeder current source coupled to the fifth MOS transistor and a second bleeder current source coupled to the sixth MOS transistor, wherein the first and second bleeder current sources provide a current level such that the first and second differential amplifiers are shut-off when the current from the first and second differential amplifier plus the first and second bleeder current respectively are less than the current flowing in the first and second current mirror respectively.

7. The folding amplifier of claim 2 further comprising:
   a compensating current source configured and arranged to provide an electrical current decaying with time during the open phase of the first and second shorting switch;

a compensation differential amplifier coupled to the compensating current source, the compensation differential amplifier having first and second inputs and first and second outputs, the first input receiving the first reference signal, the second input receiving the second reference signal, the first output coupled to the first amplifier output and the second output coupled to the second amplifier output; and a second shorting switch connected between the first and second amplifier outputs the second shorting switch having a closed phase wherein the first and second amplifier outputs are electrically connected together and an open phase wherein the first and second amplifier outputs are not electrically connected by the shorting switch, wherein the open phase of the second shorting switch occurs with the open phase of the first shorting switch has occurred.

8. The folding amplifier of claim 7 wherein the decaying current provided by the compensating current source decays in an exponential manner.

9. The folding amplifier of claim 7 wherein the switching preamplifier comprises:
a current source;
first and second MOS transistors, each having a source lead, a gate lead, and a drain lead;
the drain lead of the first and second MOS transistors coupled to the current source, the gate lead of the first MOS transistor receiving the input signal, and the gate lead of the second MOS transistor receiving the combination of the first and second reference signals;
third and fourth MOS transistors, each having a source lead, a gate lead, and a drain lead;
the source lead of the first MOS transistor coupled to the source lead and the gate lead of the third MOS transistor;
the source lead of the second MOS transistor coupled to the source lead and the gate lead of the fourth MOS transistor;
the drain lead of the third and fourth MOS transistor coupled to a reference voltage; and
wherein the first output of the switching preamplifier is a first drain current in the third MOS transistor and the second output of the switching preamplifier is a second drain current in the fourth MOS transistor.

10. The folding amplifier of claim 9 wherein the shorting switch is coupled to the source lead of the third MOS transistor and the source lead of the fourth MOS transistor.

11. The folding amplifier of claim 9 wherein the first output of the switching amplifier is coupled to the first differential amplifier via a fifth MOS transistor having a source lead, a gate lead, and a drain lead, wherein the gate lead of the fifth MOS transistor is electrically coupled to the gate lead of the third MOS transistor forming a first current mirror; and
wherein the second output of the switching amplifier is coupled to the second differential amplifier via a sixth MOS transistor having a source lead, a gate lead, and a drain lead, wherein the gate lead of the sixth MOS transistor is electrically coupled to the gate lead of the fourth MOS transistor forming a second current mirror, wherein the first and second current mirrors program the current available to the first and second differential amplifiers and thereby select the proportion of the differential output signal provided therefrom.

12. The folding amplifier of claim 11 further including a first bleeder current source coupled to the fifth MOS transistor and a second bleeder current source coupled to the sixth MOS transistor, wherein the first and second bleeder current sources provide a current level such that the first and second differential amplifiers are shut-off when the current from the first and second differential amplifier plus the first and second bleeder current respectively are less than the current flowing in the first and second current mirror respectively.

13. A folding amplifier comprising:
a switching preamplifier having first and second inputs and first and second outputs, the first input receiving an input signal, and the second input receiving a signal that is a combination of first and second reference signals;
a first shorting switch connected between the first and second outputs of the switching preamplifier, the shorting switch having a closed phase wherein the first and second outputs of the switching preamplifier are electrically connected together and an open phase wherein the first and second outputs of the switching preamplifier are not electrically connected by the shorting switch;
first and second differential amplifiers, each having first and second inputs and first and second outputs, the first and second outputs of the first differential amplifier electrically connected to the second and first outputs respectively of the second differential amplifier forming first and second amplifier outputs respectively, wherein a differential output signal is, formed as the difference between the first and second amplifier outputs;
the first input of the first differential amplifier and the first input of the second differential amplifier receiving the input signal, the second input of the first differential amplifier receiving the first reference signal and the second input of the second differential amplifier receiving the second reference signal;
the first output of the switching preamplifier coupled to the first differential amplifier and the second output of the switching preamplifier coupled to the second differential amplifier, wherein the switching preamplifier, via the first and second outputs, selects the contribution of the first and second differential amplifiers to the differential output as a function of the difference between the input signal and the combination of the first and second reference signals; and
a second shorting switch connected between the first and second differential amplifier outputs the second shorting switch having a closed phase wherein the first and second differential amplifier outputs are electrically connected together and an open phase wherein the first and second differential amplifier outputs are not electrically connected by the shorting switch, wherein the open phase of the second shorting switch begins after the open phase of the first shorting switch has occurred.

14. The folding amplifier of claim 13 wherein the switching preamplifier comprises:
a current source;
first and second MOS transistors, each having a source lead, a gate lead, and a drain lead;
the drain lead of the first and second MOS transistors coupled to the current source, the gate lead of the first MOS transistor receiving the input signal, and the gate lead of the second MOS transistor receiving the combination of the first and second reference signals;
third and fourth MOS transistors, each having a source lead, a gate lead, and a drain lead;

the source lead of the first MOS transistor coupled to the source lead and the gate lead of the third MOS transistor;

the source lead of the second MOS transistor coupled to the source lead and the gate lead of the fourth MOS transistor;

the drain lead of the third and fourth MOS transistor coupled to a reference voltage; and wherein the first output of the switching preamplifier is a first drain current in the third MOS transistor and the second output of the switching preamplifier is a second drain current in the fourth MOS transistor.

15. The folding amplifier of claim 14 wherein the first shorting switch is coupled to the source lead of the third MOS transistor and the source lead of the fourth MOS transistor.

16. The folding amplifier of claim 14 wherein the first output of the switching amplifier is coupled to the first differential amplifier via a fifth MOS transistor having a source lead, a gate lead, and a drain lead, wherein the gate lead of the fifth MOS transistor is electrically coupled to the gate lead of the third MOS transistor forming a first current mirror; and wherein the second output of the switching amplifier is coupled to the second differential amplifier via a sixth MOS transistor having a source lead, a gate lead, and a drain lead, wherein the gate lead of the sixth MOS transistor is electrically coupled to the gate lead of the fourth MOS transistor forming a second current mirror, wherein the first and second current mirrors program the current available to the first and second differential amplifiers and thereby select the proportion of the differential output signal provided therefrom.

17. The folding amplifier of claim 16 further including a first bleeder current source coupled to the fifth MOS transistor and a second bleeder current source coupled to the sixth MOS transistor, wherein the first and second bleeder current sources provide a current level such that the first and second differential amplifiers are shut-off when the current from the first and second differential amplifier plus the first and second bleeder current respectively are less than the current flowing in the first and second current mirror respectively.

18. A folding amplifier comprising:

a switching preamplifier having first and second inputs and first and second outputs, the first input receiving an input signal, and the second input receiving a signal that is a combination of first and second reference signals;

a first shorting switch connected between the first and second outputs of the switching preamplifier, the shorting switch having a closed phase wherein the first and second outputs of the switching preamplifier are electrically connected together and an open phase wherein the first and second outputs of the switching preamplifier are not electrically connected by the shorting switch;

first and second differential amplifiers, each having first and second inputs and first and second outputs, the first and second outputs of the first differential amplifier electrically connected to the second and first outputs respectively of the second differential amplifier forming first and second amplifier outputs respectively, the first input of the first differential and the first input of the second differential amplifier receiving the input signal, the second input of the first differential amplifier receiving the first reference signal and the second input of the second differential amplifier receiving the second reference signal;

the first output of the switching preamplifier coupled to the first differential amplifier and the second output of the switching preamplifier coupled to the second differential amplifier, wherein the switching preamplifier selects one of the first and second differential amplifiers via the first and second outputs of the switching preamplifier;

a compensating current source configured and arranged to provide an electrical current decaying with time during the open phase of the first and second shorting switch;

a compensation differential amplifier coupled to the compensating current source, the compensation differential amplifier having first and second inputs and first and second outputs, the first input receiving the first reference signal, the second input receiving the second reference signal, the first output coupled to the first amplifier output and the second output coupled to the second amplifier output; and a second shorting switch connected between the first and second amplifier outputs the second shorting switch having a closed phase wherein the first and second amplifier outputs are electrically connected together and an open phase wherein the first and second amplifier outputs are not electrically connected by the shorting switch, wherein the open phase of the second shorting switch occurs with the open phase of the first shorting switch has occurred.

19. The folding amplifier of claim 18 wherein the decaying current provided by the compensating current source decays in an exponential manner.

20. The folding amplifier of claim 18 wherein the switching preamplifier comprises:

a current source;

first and second MOS transistors, each having a source lead, a gate lead, and a drain lead;

the drain lead of the first and second MOS transistors coupled to the current source, the gate lead of the first MOS transistor receiving the input signal, and the gate lead of the second MOS transistor receiving the combination of the first and second reference signals;

third and fourth MOS transistors, each having a source lead, a gate lead, and a drain lead;

the source lead of the first MOS transistor coupled to the source lead and the gate lead of the third MOS transistor;

the source lead of the second MOS transistor coupled to the source lead and the gate lead of the fourth MOS transistor;

the drain lead of the third and fourth MOS transistor coupled to a reference voltage; and wherein the first output of the switching preamplifier is a first drain current in the third MOS transistor and the second output of the switching preamplifier is a second drain current in the fourth MOS transistor.

21. The folding amplifier of claim 20 wherein the shorting switch is coupled to the source lead of the third MOS transistor and the source lead of the fourth MOS transistor.

22. The folding amplifier of claim 20 wherein the first output of the switching amplifier is coupled to the first differential amplifier via a fifth MOS transistor having a source lead, a gate lead, and a drain lead, wherein the gate lead of the fifth MOS transistor is electrically coupled to the gate lead of the third MOS transistor forming a first current mirror; and wherein the second output of the switching amplifier is coupled to the second differential amplifier via a sixth MOS transistor having a source lead, a gate lead, and a drain lead, wherein the gate lead of the sixth MOS transistor is electrically coupled to the gate lead of the fourth MOS transistor forming a second current mirror, wherein the first and second current mirrors program the current available to the first and second differential amplifiers and thereby select the proportion of the differential output signal provided therefrom.

23. The folding amplifier of claim 22 further including a first bleeder current source coupled to the fifth MOS transistor and a second bleeder current source coupled to the sixth MOS transistor, wherein the first and second bleeder current sources provide a current level such that the first and second differential amplifiers are shut-off when the current from the first and second differential amplifier plus the first and second bleeder current respectively are less than the current flowing in the first and second current mirror respectively.

* * * * *